(12) United States Patent
Lou

(10) Patent No.: US 11,768,223 B2
(45) Date of Patent: Sep. 26, 2023

(54) TESTING DEVICE AND PROBE ELEMENTS THEREOF

(71) Applicant: teCat Technologies (Suzhou) Limited, Suzhou (CN)

(72) Inventor: Choon Leong Lou, Suzhou (CN)

(73) Assignee: TECAT TECHNOLOGIES (SUZHOU) LIMITED, Suzhou (CN)

( * ) Notice: Subject to any disclaimer, the term of this patent is extended or adjusted under 35 U.S.C. 154(b) by 0 days.

(21) Appl. No.: 17/583,361

(22) Filed: Jan. 25, 2022

(65) Prior Publication Data
US 2022/0390487 A1 Dec. 8, 2022

(30) Foreign Application Priority Data
Jun. 4, 2021 (CN) .......................... 202110622902.9

(51) Int. Cl.
| | | |
|---|---|---|
| G01R 1/04 | (2006.01) | |
| G01R 1/067 | (2006.01) | |
| G01R 1/073 | (2006.01) | |
| G01R 1/36 | (2006.01) | |
| G01R 31/00 | (2006.01) | |
| G01R 35/00 | (2006.01) | |

(52) U.S. Cl.
CPC .................. *G01R 1/0433* (2013.01)

(58) Field of Classification Search
CPC .......... G01R 1/04; G01R 1/067; G01R 1/073; G01R 1/36; G01R 31/00; G01R 31/02; G01R 31/20; G01R 35/00
See application file for complete search history.

(56) References Cited

U.S. PATENT DOCUMENTS 8,063,651 B2 * 11/2011 Kamata .............. G01R 1/06727
                                                                 216/11
9,588,139 B2 * 3/2017 Fan ..................... G01R 1/06733
(Continued)

FOREIGN PATENT DOCUMENTS

| JP | 2006234428 A | 9/2006 |
|---|---|---|
| JP | 2006300807 A | 11/2006 |

(Continued)

OTHER PUBLICATIONS

Japan Patent Office, Office action dated Nov. 24, 2022.
Taiwan Patent Office, Office action dated Nov. 15, 2022.

*Primary Examiner* — Neel D Shah
(74) *Attorney, Agent, or Firm* — Li & Cai Intellectual Property (USA) Office

(57) ABSTRACT

A testing device and probe elements thereof are provided. The testing device includes a circuit substrate, a plurality of probe elements, a first housing and a second housing. The plurality of probe elements are independent of each other and arranged at fixed intervals. Each probe element comprises a body, a first contact section and a second contact section. The body is provided with a plurality of strip-shaped perforations, and the body includes a first lateral side and a second lateral side opposite to each other. The first contact section is connected to the first lateral side, and the second contact section is connected to the second lateral side. The extension direction of the first contact section relative to the body and the extension direction of the second contact section relative to the body are distinct from each other.

14 Claims, 4 Drawing Sheets

(56) References Cited

U.S. PATENT DOCUMENTS

| | | | |
|---|---|---|---|
| 10,935,573 B2* | 3/2021 | Walczyk | G01R 1/06711 |
| 2019/0265275 A1* | 8/2019 | Hsieh | G01R 1/06727 |
| 2021/0041482 A1* | 2/2021 | Kishi | G01R 1/06727 |

FOREIGN PATENT DOCUMENTS

| | | | |
|---|---|---|---|
| JP | 2006337229 A | 12/2006 | |
| JP | 2009115585 A | 5/2009 | |
| JP | 2013171005 A | 9/2013 | |
| JP | 2014001924 A | 1/2014 | |
| TW | 202045933 A | 12/2020 | |
| TW | 202111331 A | 3/2021 | |

* cited by examiner

TESTING DEVICE AND PROBE ELEMENTS THEREOF

FIELD OF THE DISCLOSURE

The present invention relates to a testing device and probe elements thereof, and more particularly, to a testing device which is provided with strip-shaped perforations to increase the elasticity of the overall structure, and probe elements thereof.

BACKGROUND OF THE DISCLOSURE

At present, a probe element of a testing device contacts an object under test (e.g., an IC) and a circuit substrate (e.g., a test carrier plate) at both ends, respectively, so that the circuit substrate is electrically connected with the object under test to test the object under test. The probe elements in the prior art mainly uses two elastic plastic rods to abut against the upper and lower sides of the probe element, so that the contact of the probe element with the circuit substrate and the object under test, respectively, can be stable. However, the stability of the elasticity of the plastic rod itself is difficult to predict and control. For example, when the testing environment temperature is high, the elasticity of the plastic rod will change. As another example, when the probe elements are in close proximity, the elasticity of the plastic rod for different probe elements is not easily accurately controlled. Accordingly, during a test, such a technical means is likely to cause scratch damage of the circuit substrate by the probe element or poor electrical contact between the probe element and the object under test.

Therefore, how to overcome the above drawbacks through the improvement of structural design has become one of the important topics to be solved in this field.

SUMMARY OF THE DISCLOSURE

The technical problem to be solved by the present invention is to, in view of the deficiencies in the prior art, provide a testing device and probe elements thereof.

To address the above technical problems, one of the technical solutions used by the present invention is to provide a testing device comprising a circuit substrate, a plurality of probe elements, a first housing and a second housing. The plurality of probe elements are independent of each other and arranged at fixed intervals. Each probe element comprises a body, a first contact section and a second contact section. At least one of the body, the first contact section and the second contact section is provided with a plurality of strip-shaped perforations, and the body includes a first lateral side and a second lateral side opposite to each other. The first contact section is connected to the first lateral side, and the second contact section is connected to the second lateral side. The extension direction of the first contact section relative to the body and the extension direction of the second contact section relative to the body are different from each other. A first end of the first contact section abuts an object under test. A second end of the second contact section abuts the circuit substrate. A first housing is disposed above each probe element and abut against the first lateral side of each probe element. A second housing is disposed below each probe element and abut against the second lateral side of each probe element.

Preferably, at least two of the strip-shaped perforations are of the same size and shape.

Preferably, at least two of the strip-shaped perforations are disposed side by side top and down.

Preferably, the elastic coefficient of the probe element is changed by adjusting the number, spacing, size and/or shape of the strip-shaped perforations.

Preferably, the thickness of each of the probe elements is between 40 microns and 50 microns.

Preferably, the body of each probe element forms step structures on the first lateral side and the second lateral side, respectively, so that the first housing and the second housing abut against the body, respectively.

Preferably, each probe element abuts each contact point of the object under test.

Preferably, at least two of the probe elements abut each contact point of the object under test.

Preferably, at least two of the probe elements are combined into one.

To address the above technical problems, another technical solution used by the present invention is to provide a testing device comprising a body, a first contact section and a second section. The body comprises a first lateral side and a second lateral side opposite to each other, and the body is provided with a plurality of strip-shaped perforations. The first contact section is connected to the first lateral side. The first contact section comprises a first end abutting an object under test. The second contact section is connected to the second lateral side. The second contact section comprises a second end abutting a circuit substrate, and the extension direction of the second contact section relative to the body and the extension direction of the first contact section relative to the body are distinct from each other.

Preferably, at least two of the strip perforations are of the same size and shape.

Preferably, at least two of the strip-shaped perforations are disposed side by side top and down.

Preferably, the elastic coefficient of the probe element is changed by adjusting the number, spacing, size and/or shape of the strip perforations.

Preferably, the thickness of the probe elements is between 40 microns and 50 microns.

Preferably, the body of the probe elements forms step structures on the first lateral side and the second lateral side, respectively.

One of the beneficial effects of the present invention is that according to the testing device and probe elements thereof provided by the present invention, through the technical solutions of "the body is provided with a plurality of strip-shaped perforations" and "the plurality of probe elements are independent of each other and arranged at fixed intervals", the elasticity of the overall structure of the probe elements can be increased without the need for an external plastic rod, thus improving the stability of the structure.

BRIEF DESCRIPTION OF THE DRAWINGS

In order to enable a further understanding of the features and technical content of the present invention, refer to the following detailed description and drawings of the present invention. However, the drawings are provided only for reference and description, and are not used to limit the present invention.

DETAILED DESCRIPTION OF THE EXEMPLARY EMBODIMENTS

The following is to illustrate the implementation of "a testing device and probe elements thereof" disclosed in the present invention by means of specific embodiments. Those skilled in the art can understand the advantages and effects of the present invention from the content disclosed in this specification. The present invention can be implemented or applied through other different specific embodiments, and various modifications and alterations can be made to various details in this specification based on different viewpoints and applications without departing from the concept of the present invention. Additionally, it should be noted that the drawings of the present invention are merely schematic illustrations, and are not drawn according to actual size. The following embodiments will further describe in detail the related technical content of the present invention, but the content disclosed is not intended to limit the protection scope of the present invention.

It should be understood that although terms such as "first", "second", and "third" may be used herein to describe various elements, these elements should not be limited by these terms. These terms are mainly used to distinguish one element from another. Additionally, the term "or" used herein may include a combination of any one or more of the associated listed items depending on the actual situation.

Embodiments

Figure 1:
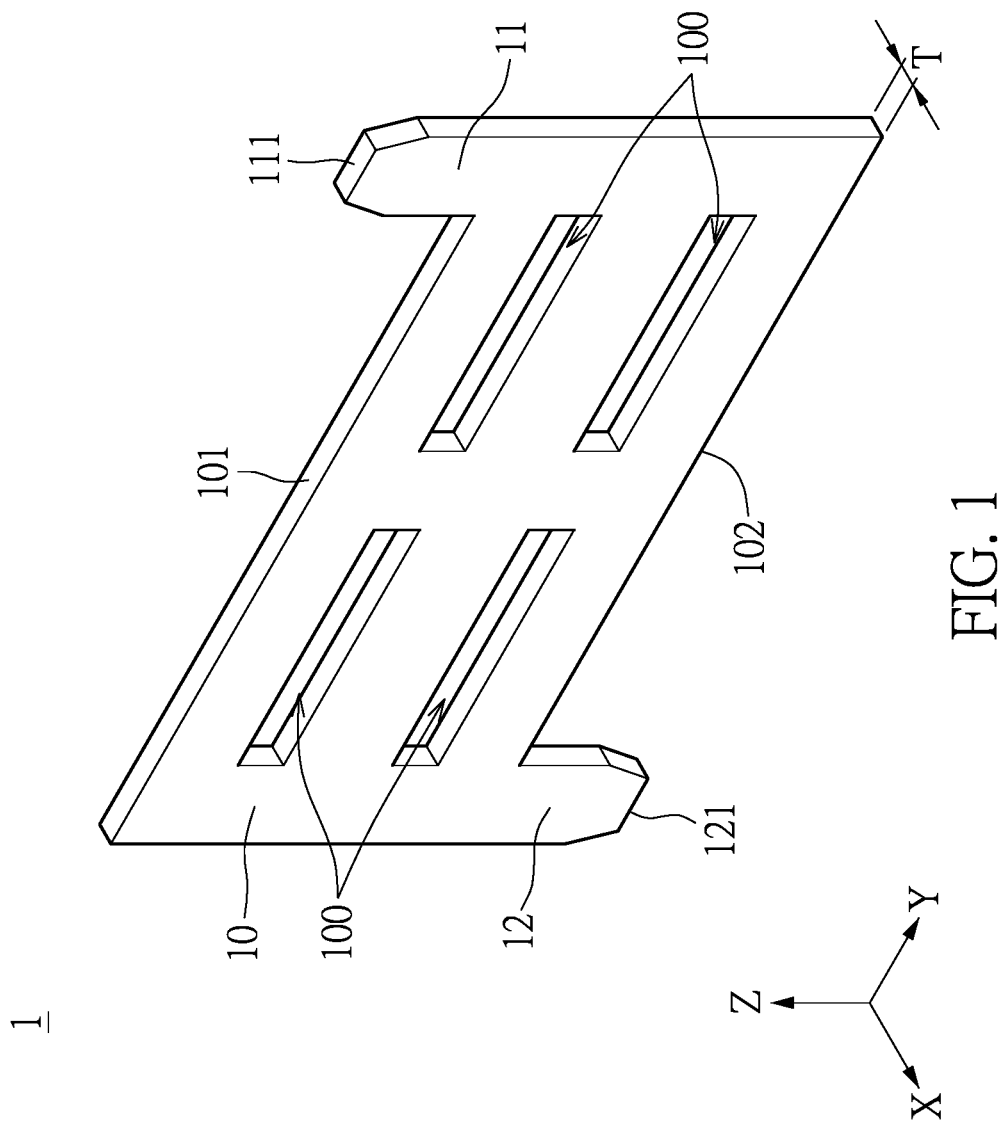
FIG. 1 is a schematic perspective view of a probe element according to an embodiment of the present invention.

Refer to FIG. 1, which is a schematic perspective view of a probe element of the present invention. The present invention provides a testing device 1. The probe element 1 is a sheet-like probe structure, comprising a body 10, a first contact section 11 and a second contact section 12. The body 10 comprises a first lateral side 101 and a second lateral side 102 opposite to each other. The first contact section 11 is connected to the first lateral side 101. The second contact section 12 is connected to the second lateral side 102. The extension direction of the second contact section 12 relative to the body 10 and the extension direction of the first contact section 11 relative to the body 10 are distinct from each other. In particular, the first contact section 11 extends relative to the body 10 in the direction of positive Z-axis, while the second contact section 12 extends relative to the body 10 in the direction of negative Z-axis, and the first contact section 11 and the second contact section 12 are disposed at diagonal areas of the body 10, respectively. In addition, the body 10 is provided with a plurality of strip-shaped perforations 100. At least a portion of the plurality of the strip-shaped perforations 100 are of the same size and shape. At least a portion of the plurality of the strip-shaped perforations 100 are disposed side by side top and down. It should be noted that the present invention does not limit a specific shape, size and number of the strip-shaped perforations 100. Additionally, the thickness T of the probe elements 1 is between 40 microns and 50 microns, for example.

It should be mentioned that the probe element 1 shown in FIG. 1 is merely for ease of illustration, and is not used to limit a specific shape of the probe element 1. For example, with reference to the probe elements 1 in FIG. 2 and FIG. 3, it can be seen that the probe elements 1 of the present invention may have a variety of embodiments.

Figure 2:
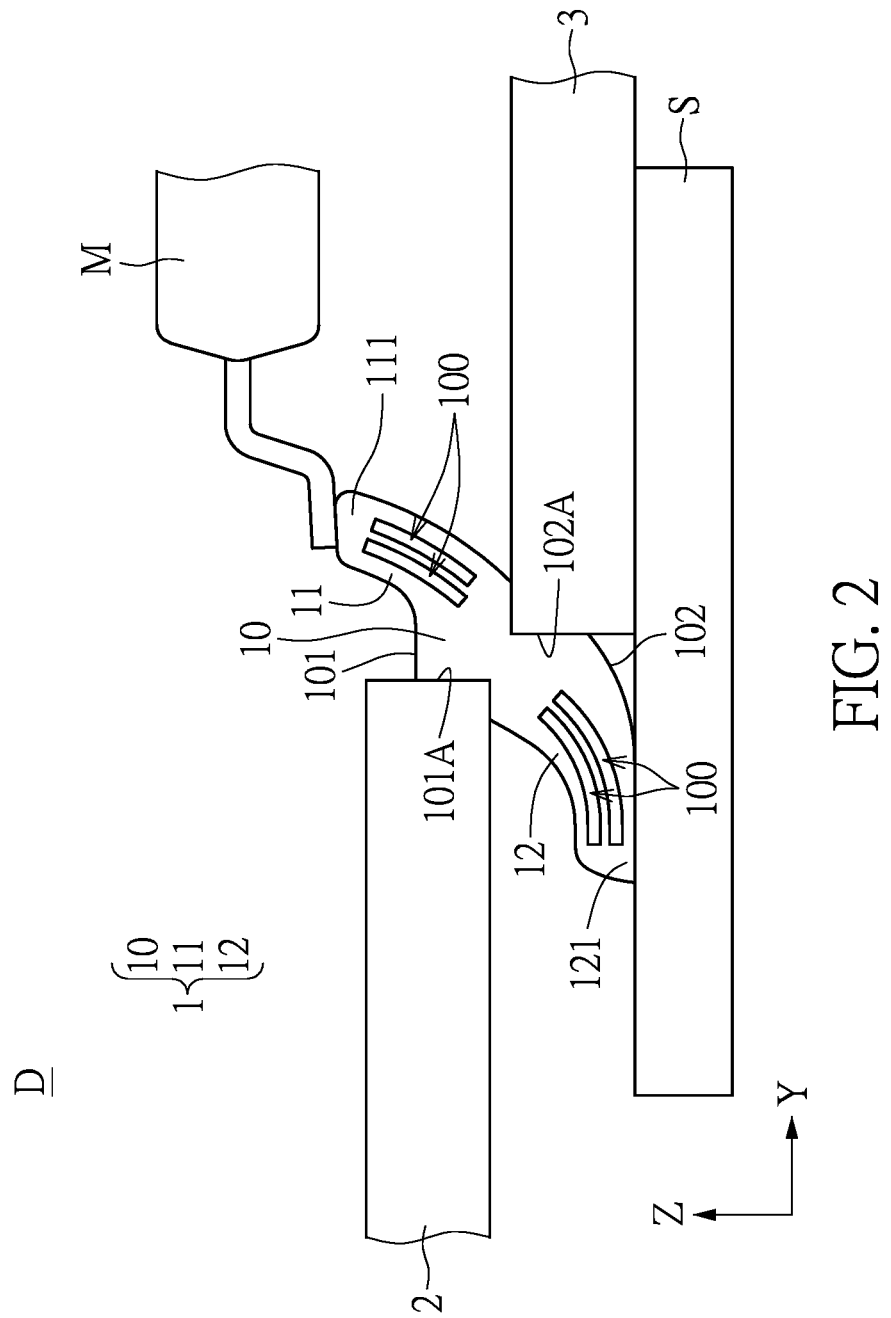
FIG. 2 is a schematic diagram of one embodiment of a testing device and probe elements thereof of the present invention.
Figure 3:
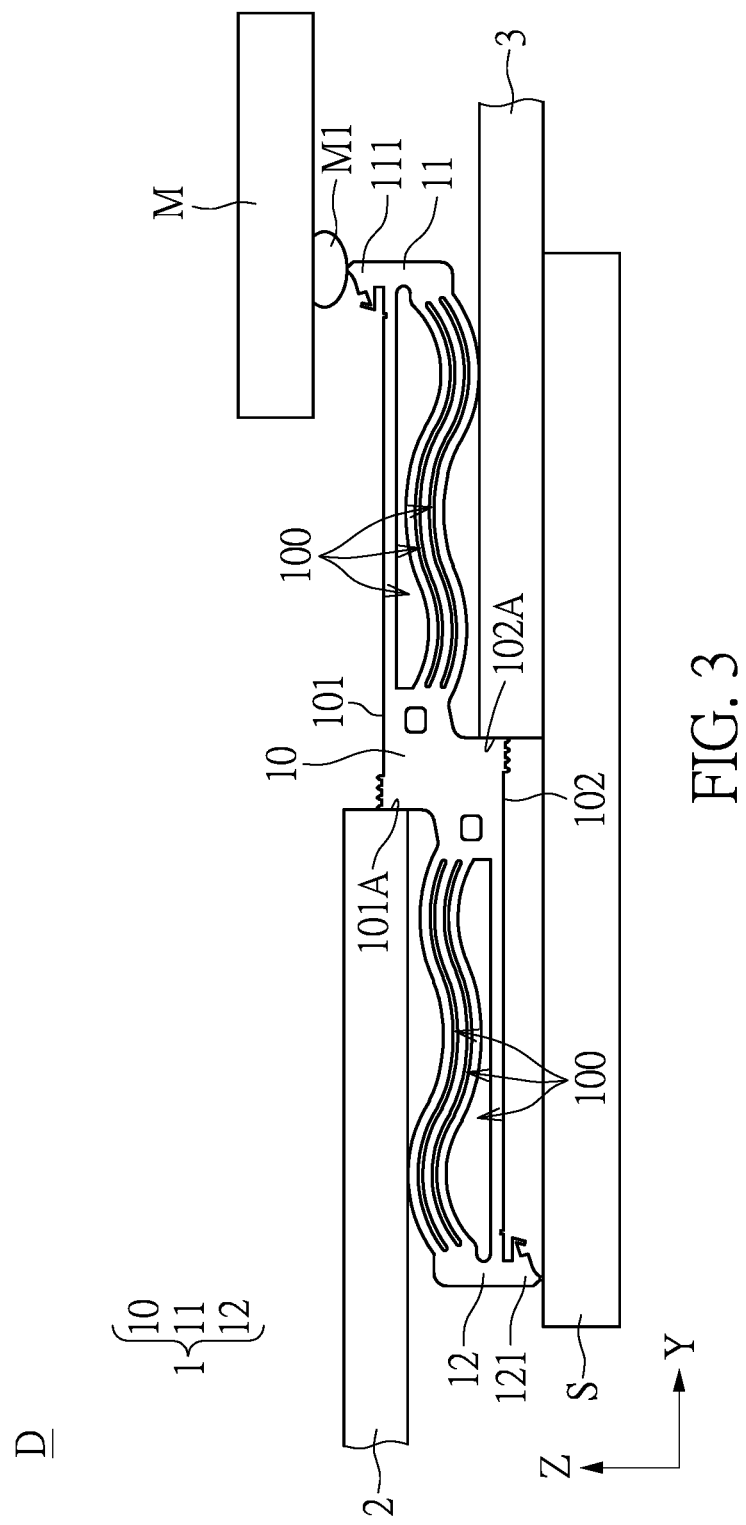
FIG. 3 is a schematic diagram of another embodiment of the testing device and probe elements thereof of the present invention.

Further refer to FIG. 2 and FIG. 3, which respectively are schematic diagrams of two embodiments of the testing device and probe elements 1 thereof of the present invention. It should be noted that FIG. 2 and FIG. 3 use a combination of multiple probe elements 1 arranged side by side as an example, to be more exact, a combination of three probe elements 1 arranged side by side as an example. However, FIGS. 2 and 3 are shown in the perspective of the X-axis direction. For the convenience of showing the overall structure, they are provided in connection with FIG. 4 or FIG. 5, which are shown in the perspective of the Y-axis direction.

In view of the above, the testing device D includes: a circuit substrate S, a plurality of probe elements 1, a first housing 2 and a second housing 3. The plurality of probe elements 1 are independent of each other and arranged at fixed intervals (see FIG. 4 or FIG. 5). Each probe element 1 includes a body 10, a first contact section 11, and a second contact section 12 (see FIG. 2 or FIG. 3). At least one of the body 10, the first contact section 11 and the second contact section 12 is provided with a plurality of strip-shaped perforations 100. The body 10 includes a first lateral side 101 and a second lateral side 102 opposite to each other. The first contact section 11 is connected to the first lateral side 101, and the second contact section 12 is connected to the second lateral side 102. The extension direction of the first contact section 11 relative to the body 10 and the extension direction of the second contact section 12 relative to the body 10 are distinct from each other. A first end 111 of the first contact section 11 abuts an object M under test, and a second end 121 of the second contact section 12 abuts the circuit substrate S. For example, the object M under test is, for example, but not limited to, an IC chip, and the circuit substrate S may be a printed circuit board (PCB) or a flexible printed circuit board (FPCB); and the present invention is not limited thereto. The first housing 2 is disposed above the plurality of probe elements 1 and abuts against the first lateral side 101 of the plurality of probe elements 1. The second housing 3 is disposed below the plurality of probe elements 1 and abuts against the second lateral side 102 of the plurality of probe elements 1. In other embodiments of the present invention, the plurality of probe elements 1, the first housing 2 and the second housing 3 may be integrated into a module or a socket.

Continuing to refer to FIG. 2, the probe element 1 of the testing device D in FIG. 2 is basically of an irregular shape, and the plurality of strip-shaped perforations 100 are roughly evenly distributed in the first contact section 11 and the second contact section 12. The first end 111 of the first contact section 11 abuts the object M under test, and the second end 121 of the second contact section 12 abuts the circuit substrate S. The body 10 forms step structures 101A, 102A on the first lateral side 101 and the second lateral side 102, respectively. Specifically, the first housing 2 abuts against the step structure 101A of the first lateral side 101, and the second housing 3 abuts against the step structure 102A of the second lateral side 102. Thereby, when the probe element 1 contacts the object M under test and the circuit substrate S, the probe element 1 uses the gaps formed by the plurality of strip-shaped perforations 100 to increase the structural flexibility of the probe element 1 itself, without the need for additional elastic components. Also, since the first housing 2 and the second housing 3 firmly fix the probe element 1 in the horizontal direction, the probe element 1 will only be subjected to vertical force to cause the first contact section 11 to displace up and down without sliding in the horizontal direction, so that scratches on the circuit substrate S are reduced, and a stable contact between the probe element 1 and the object M under test is maintained.

Continuing to refer to FIG. 3, the probe element 1 of the testing device D in FIG. 3 is roughly polygonal, and the plurality of strip-shaped perforations 100 are roughly evenly distributed on the body 10. The first end 111 of the first contact section 11 abuts a contact point, namely, a solder ball M1, on the object M under test, and the second end 121 of the second contact section 12 abuts the circuit substrate S. Thereby, the object M under test and the circuit substrate S are electrically connected through the probe element 1. It should be noted that the object M under test may have one or more contact points (solder ball M1), and in the embodiment of FIG. 3, each probe element 1 abuts each contact point (solder ball M1) of the object M under test. The first housing 2 abuts against the step structure 101A of the first lateral side 101, and the second housing 3 abuts against the step structure 102A of the second lateral side 102. When the probe element 1 contacts the object M under test and the circuit substrate S, the probe element 1 uses the gaps formed by the plurality of strip-shaped perforations 100 to increase the structural flexibility of the probe element 1 itself, without the need for additional elastic components. Also, since the first housing 2 and the second housing 3 firmly fix the probe element 1 in the horizontal direction, the probe element 1 will only be subjected to vertical force to cause the first contact section 11 to displace up and down without sliding in the horizontal direction, so that scratches on the circuit substrate S can be reduced, and a stable contact between the probe element 1 and the object M under test is maintained.

In the present invention, the number, spacing, size and/or shape of the plurality of strip-shaped perforations 100 are adjusted to change the elastic coefficient of the probe element 1. However, by comparing FIG. 2 and FIG. 3, it can be seen that the shapes of the probe elements 1 of FIG. 2 and FIG. 3 differ greatly, and the plurality of strip-shaped perforations 100 in the probe element 1 of FIG. 2 and the plurality of strip-shaped perforations 100 in the probe element 1 of FIG. 3 differ as well, in shape, size and distribution position. In other words, the present invention does not limit a specific shape of the probe element 1, nor does it limit a specific shape, size, and number of the strip-shaped perforations 100.

Figure 5:
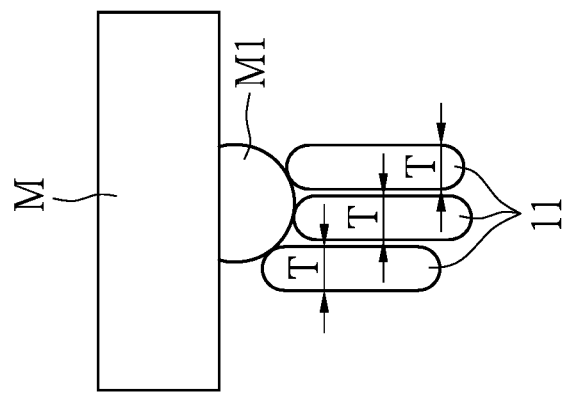
FIG. 4 and FIG. 5 are partial schematic diagrams showing a plurality of probe elements abutting an object under test according to the present invention.
Figure 4:
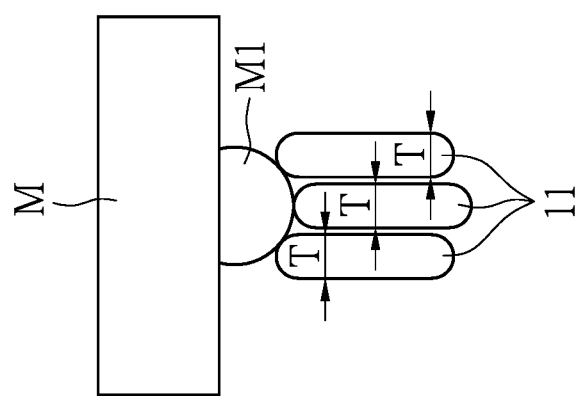

In addition, continue to refer to FIGS. 4 and 5, which are partial schematic diagrams showing a plurality of probe elements 1 abutting an object under test according to the present invention. The plurality of probe elements 1 are independent of each other and arranged at fixed intervals, and the thickness T of each probe element 1 is between 40 microns and 50 microns. To be exact, FIGS. 4 and 5 show that the first contact section 11 of the plurality of probe elements 1 abuts only one contact point of the object M under test, and the contact point is shown as a solder ball M1. Specifically, in the embodiments of FIGS. 4 and 5, at least two probe elements 1 of the plurality of probe elements 1 abut each contact point (solder ball M1) of the object M under test, and further, at least two of the probe elements 1 can be combined into one. More preferably, the object under test may be a packaged IC or a packaged module. The contact point can be a pin or a pad. The probe elements, the first housing and the second housing may be integrated into a module or a socket. The plurality of probe elements 1 of the present invention are independent of each other and arranged at fixed intervals, so that the multiple probe elements 1 can maintain a good electrical contact with the solder ball M1 of the object M under test by means of their own elastic structures (i.e., the strip-shaped perforation 100), and the number, spacing, size and/or shape of the plurality of strip-shaped perforations 100 are adjusted to change the elastic coefficient of the plurality of probe elements 1. Specifically, as shown in FIG. 4, the solder ball M1 in FIG. 4 is disposed at the top of the right middle of the three probe elements 1, and thus the first contact section 11 of the middle probe element 1 bears a larger vertical direction force to produce downward displacement, so that the solder ball M1 is in contact with all the first contact sections 11 of the three probe elements 1, wherein the three probe elements 1 can also be combined into one. As further shown in FIG. 5, the solder ball M1 in FIG. 5 is disposed at the upper right side of the three probe elements 1, and thus the first contact sections 11 of the two probe elements 1 in the middle and the right side bear larger vertical direction force to produce downward displacement, so that the solder ball M1 is in contact with all the first contact sections 11 of the three probe elements 1. In other words, through the structural design in which the plurality of probe elements 1 of the present invention are independent of each other and arranged at fixed intervals, it will not happen that there is a probe element 1 not in contact with the solder ball M1. Thereby, the contact areas between the three probe elements 1 and the solder ball M1 can be kept consistent, so that signal transmission between the object M under test and the circuit substrate S remains stable.

Advantageous Effects of the Embodiments

One of the beneficial effects of the present invention is that according to a testing device D and probe elements 1 thereof provided by the present invention, through the technical solutions of "the body 10 is provided with a plurality of strip-shaped perforations 100" and "the plurality of probe elements 1 are independent of each other and arranged at fixed intervals", the elasticity of the overall structure of the probe elements can be increased without the need for an external plastic rod, thus improving the stability of the structure.

Further, the probe element 1 uses the gaps formed by the plurality of strip-shaped perforations 100 to increase the structural flexibility of the probe element 1 itself, without the need for additional elastic components. Also, since the first housing 2 and the second housing 3 firmly fix the probe element 1 in the horizontal direction, the probe element 1 will only be subjected to vertical force to displace up and down without sliding in the horizontal direction, so that scratches on the circuit substrate S can be reduced, and a stable contact between the probe element 1 and the object M under test is maintained.

Still further, the plurality of probe elements 1 of the present invention are independent of each other and arranged at fixed intervals, so that the plurality of probe elements 1 are able to maintain consistent contact areas and a good electrical contact with the solder ball M1 of the object M under test by means of their own elastic structures (i.e., the strip-shaped perforations 100), so that signal transmission between the object M under test and the circuit substrate S remains stable.

The content disclosed above is merely preferred feasible embodiments of the present invention, and is not intended to limit the protection scope of the claims of the present invention, and therefore, any equivalent structural changes made by using the content of the specification and the drawings of the present invention should be included in the protection scope of the claims of the present invention.

What is claimed is:

1. A probe element, the probe element comprising:
   a body comprising a first lateral side and a second lateral side opposite to each other, the body being provided with a plurality of strip-shaped perforations;
   a first contact section connected to the first lateral side; and
   a second contact section connected to the second lateral side, the extension direction of the second contact section relative to the body and the extension direction of the first contact section relative to the body being distinct from each other,
   wherein two step structures are formed respectively on the first lateral side and the second lateral side of the body.

2. The probe element according to claim 1, wherein at least two of the strip-shaped perforations are of same size and shape.

3. The probe element according to claim 1, wherein at least two of the strip-shaped perforations are arranged side by side top and down.

4. The probe element according to claim 1, wherein the elastic coefficient of the probe element is changed by adjusting the number, spacing, size and/or shape of the strip-shaped perforations.

5. The probe element according to claim 1, wherein a thickness of the probe element is between 40 microns and 50 microns.

6. A testing device, the testing device comprising:
   a circuit substrate;
   a plurality of probe elements independent of each other and arranged at fixed intervals, each of the probe elements comprising a body, a first contact section and a second contact section, at least one of the body, the first contact section and the second contact section being provided with a plurality of strip-shaped perforations, a first end of the first contact section abutting an object under test, and a second end of the second contact section abutting the circuit substrate;
   a first housing disposed above each of the probe elements and abutting against a first lateral side of each of the probe elements; and
   a second housing disposed below each of the probe elements and abutting against a second lateral side of each of the probe elements,
   wherein two step structures are formed respectively on the first lateral side and the second lateral side of the body,
   wherein the first housing abuts against the step structure of the first lateral side and the second housing abuts against the step structure of the second lateral side, the first housing and the second housing fix the probe elements in the horizontal direction.

7. The testing device according to claim 6, wherein the object under test has a plurality of contact points, each of the probe elements abutting each of the contact points of the object under test.

8. The testing device according to claim 7, wherein at least two probe elements of the plurality of probe elements abut each of the contact points of the object under test.

9. The testing device according to claim 7, wherein at least two of the probe elements are combined into one.

10. The testing device according to claim 6, wherein the plurality of probe elements, the first housing and the second housing are integrated into a module or a socket.

11. The testing device according to claim 6, wherein at least two of the strip-shaped perforations are of the same size and shape.

12. The testing device according to claim 6, wherein at least two of the strip-shaped perforations are arranged side by side top and down.

13. The testing device according to claim 6, wherein the elastic coefficient of each of the probe elements is changed by adjusting the number, spacing, size and/or shape of the strip-shaped perforations.

14. The testing device according to claim 6, wherein a thickness of each of the probe elements is between 40 microns and 50 microns.

* * * * *